US007839234B2

(12) United States Patent
Prikhodko et al.

(10) Patent No.: US 7,839,234 B2
(45) Date of Patent: Nov. 23, 2010

(54) SWITCHING MODULE WITH HARMONIC PHASE TUNING FILTER

(75) Inventors: Dima Prikhodko, Woburn, MA (US); Gene A. Tkachenko, Belmont, MA (US); Richard A. Carter, Hampton, NH (US); Sergey Nabokin, Pelham, NH (US); Jason Chiesa, Pelham, NH (US); Steven C. Sprinkle, Hampstead, NH (US); Yu Zhu, Wellesley, MA (US); Beverly A. Peluso, Wilmington, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 61 days.

(21) Appl. No.: 11/827,616

(22) Filed: Jul. 12, 2007

(65) Prior Publication Data

US 2008/0079513 A1  Apr. 3, 2008

Related U.S. Application Data

(60) Provisional application No. 60/848,680, filed on Oct. 2, 2006.

(51) Int. Cl.
*H01P 5/08* (2006.01)
*H03H 7/01* (2006.01)
*H01P 1/15* (2006.01)

(52) U.S. Cl. .......................... 333/103; 333/32; 333/175
(58) Field of Classification Search ................ 333/103, 333/32, 175
See application file for complete search history.

(56) References Cited

U.S. PATENT DOCUMENTS 5,528,196 A   6/1996 Baskin et al.
5,644,268 A   7/1997 Hang
6,163,713 A   12/2000 Suzuki et al.
6,560,443 B1  5/2003 Vaisanen et al.

(Continued)

FOREIGN PATENT DOCUMENTS

JP    1997-083259    3/1997

OTHER PUBLICATIONS

"Digital Cellular Telecommunications System (Phase 2+)", Radio Transmission and Reception, 3GPP TS 05.05 version 8.6.0 Release 1999, pp. 1-95. Sep. 2000.

(Continued)

*Primary Examiner*—Benny Lee
*Assistant Examiner*—Alan Wong
(74) *Attorney, Agent, or Firm*—Lando & Anastasi, LLP

(57) ABSTRACT

According to one exemplary embodiment, a switching module includes a first harmonic phase tuning filter coupled to a first input of an RF switch. The first harmonic phase tuning filter is configured to provide an output impedance that substantially matches an input impedance of the RF switch at approximately a fundamental frequency and to provide a high impedance at approximately a harmonic frequency generated by the RF switch. The first harmonic phase tuning filter includes an LC circuit coupled between input and output terminals of the first harmonic phase tuning filter and tuned to provide the high impedance at approximately the harmonic frequency generated by the RF switch. The RF switching module further includes a second harmonic phase tuning filter coupled to a second input of the RF switch. The first and second harmonic phase tuning filters can be fabricated on a single semiconductor die.

8 Claims, 6 Drawing Sheets

U.S. PATENT DOCUMENTS

| | | |
|---|---|---|
| 6,642,578 B1 | 11/2003 | Arnold et al. |
| 6,803,502 B2 | 10/2004 | Bilyeu |
| 6,804,502 B2 | 10/2004 | Burgener et al. |
| 6,829,471 B2 | 12/2004 | White et al. |
| 6,835,968 B2 | 12/2004 | Kitazawa et al. |
| 6,876,258 B2 * | 4/2005 | Ohta et al. .................. 330/286 |
| 6,917,259 B2 | 7/2005 | Hirabayashi |
| 7,098,755 B2 | 8/2006 | Zhao et al. |
| 7,098,759 B2 | 8/2006 | Chang |
| 7,199,635 B2 | 4/2007 | Nakatsuka et al. |
| 7,202,736 B1 | 4/2007 | Dow et al. |
| 7,206,551 B2 * | 4/2007 | Itakura et al. ................. 455/73 |
| 7,259,643 B2 | 8/2007 | Son et al. |
| 7,391,283 B2 | 6/2008 | Kearns |
| 7,417,515 B2 | 8/2008 | Chominski |
| 7,418,251 B2 * | 8/2008 | Liu ............................ 455/333 |
| 7,459,988 B1 | 12/2008 | Iverson |
| 7,479,988 B2 | 1/2009 | Sase et al. |
| 7,492,209 B2 | 2/2009 | Prikhodko et al. |
| 2004/0127182 A1 | 7/2004 | Hayashi |
| 2004/0132487 A1 | 7/2004 | Kearns |
| 2005/0012400 A1 | 1/2005 | Gresham |
| 2005/0282503 A1 * | 12/2005 | Onno et al. ................... 455/78 |
| 2005/0287976 A1 | 12/2005 | Bergener et al. |
| 2006/0051038 A1 * | 3/2006 | Imai et al. ................... 385/122 |
| 2006/0158911 A1 | 7/2006 | Lincoln et al. |
| 2008/0079514 A1 | 4/2008 | Prikhodko et al. |
| 2008/0180189 A1 | 7/2008 | Miya |

OTHER PUBLICATIONS

Gotch et al., "State-of-the-Art Low Loss, High Isolation SP6T Switch for Handset Applications", European Conference on Wireless Technology, 17-20 (2004).

Holm et al., "Charge Effects and Transient Simulation of p-HEMT Meander Gate Switches" EuMA, Sep. 2006, pp. 367-370.

Kohama et al., "High Power DPDT Antenna Switch MMIC for Digital Cellular System", IEEE Journal of Solid State Circuits, vol. 31, No. 10, Oct. 1996, pp. 1406-1411.

Masuda et al., "High Power Heterojunction GaAs Switch IC with P-1dB of more than 38dBm for GSM Application", IEEE, 1998, pp. 229-232.

Shifin et al., "Monolithic FET Structures for High-Power Control Component Applications", IEEE Transactions on Microwave Theory and Techniques, vol. 37, No. 12, Dec. 1989, pp. 2134-2141.

Yasuda, et al., An Ultra-Low Distortion 3P2T Antenna Switch MMIC for Dual-band W-CDMA Applications, IEEE, 2005, pp. 445-458.

D. Prikhodko et al., "Design of a Low VSWR Harmonics, Low Loss SP6T Switch for GSM/Edge Applications," Proceedings of the 2nd European Microwave Integrated Circuits Conference, Munich, Germany, Oct. 2007.

D. Prikhodko et al., "Optimum Matching Technique for the Switch Design," IEEE, 2007.

* cited by examiner

SWITCHING MODULE WITH HARMONIC PHASE TUNING FILTER

The present application claims the benefit of and priority to a provisional patent application entitled "Integrated Harmonic Matching for RF Switches," Ser. No. 60/848,680 filed on Oct. 2, 2006. The disclosure in that provisional application is hereby incorporated fully by reference into the present application.

BACKGROUND OF THE INVENTION

1. Field of the Invention

The present invention is generally in the field of electrical circuits. More specifically, the invention is in the field of communications circuits.

2. Related Art

Multi-throw RF switches having multiple inputs and a shared output can be used in mobile communication devices, such as cellular handsets, to provide operation at more than one frequency. For example, a multi-throw RF switch can be used in a cellular handset operating in a system using a global system for mobile communications (GSM) communications standard to enable the cellular handset to operate either at a low band frequency of 900.0 MHz or a high band frequency of 1800.0 MHz by selectively coupling a corresponding input to the shared output. For multi-throw RF switches, such as multi-throw RF switches used in mobile communication devices using the GSM communications standard, there is a continuing need to reduce harmonics, such as third harmonics, generated by the switch and generated by power amplifiers that are coupled to the inputs of the switch.

A conventional multi-throw RF switch can include two or more switching arms, where each switching arm includes a number of field effect transistors (FETs) coupled in "series," and where each switching arm is coupled to a separate input, which can be coupled to a power amplifier, and a shared output, which can be coupled to an antenna. To reduce harmonics generated by the power amplifier, a conventional filter, which is a discrete filtering device, can be coupled between the input of the RF switch and the power amplifier. Although the conventional filter can reduce the level of harmonics generated by the power amplifier, it (i.e. the conventional filter) may not provide a sufficient reduction in harmonics, such as third harmonics, generated by an RF switch, such as a multi-throw RF switch.

SUMMARY OF THE INVENTION

A switching module with harmonic phase tuning filter, substantially as shown in and/or described in connection with at least one of the figures, as set forth more completely in the claims.

DETAILED DESCRIPTION OF THE INVENTION

The present invention is directed to a switching module with harmonic phase tuning filter. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
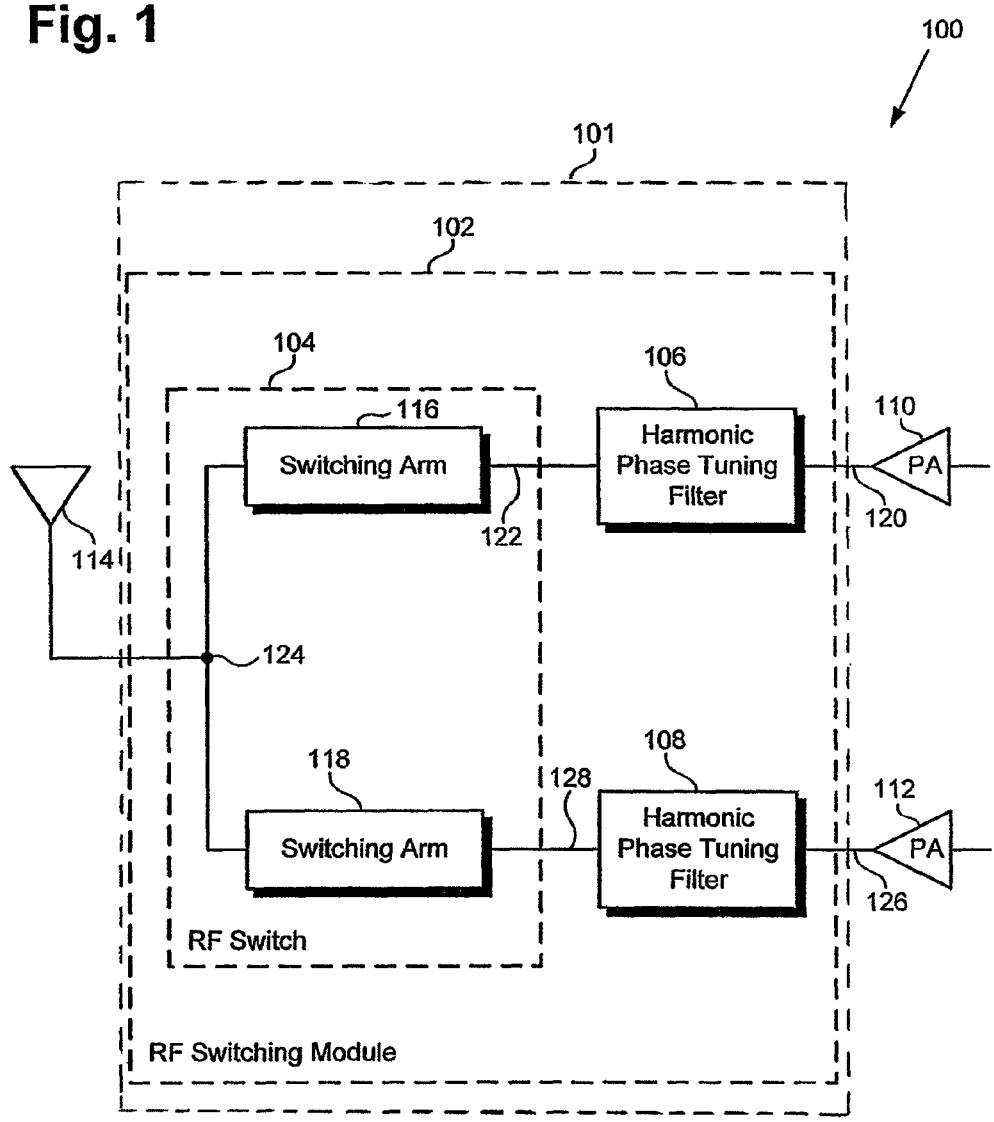
FIG. 1 illustrates a block diagram of an exemplary RF transmit system in accordance with one embodiment of the present invention.

FIG. 1 shows a block diagram of RF transmit system 100 in accordance with one embodiment of the present invention. RF transmit system 100 includes RF switching module 102 (also referred to simply as a "switching module" in the present application), which includes RF switch 104 and harmonic phase tuning filters 106 and 108, power amplifiers 110 and 112, and antenna 114. RF switch 104 includes switching arms 116 and 118. RF transmit system 100 can be an RF transmit sub-block of a communications system, such as a communications system using GSM or wideband code-division multiple access (W-CDMA) communications standards, which can include an RF receive sub-block (not shown in FIG. 1). In the present embodiment, RF switching module 102 can be fabricated on a single semiconductor die 101 so as to integrate RF switch 104 and harmonic phase tuning filters 106 and 108.

As shown in FIG. 1, the output of power amplifier (PA) 110 is coupled to the input of harmonic phase tuning filter 106 via line 120 and the output of harmonic phase tuning filter 106 is coupled to the input of switching arm 116 at an input of RF switch 104 by line 122. Power amplifier 110 can output an RF signal, such as an 1800.0 MHz high band GSM signal, for transmission over antenna 114 when switching arm 116 of RF switch 102 is enabled. RF switch 104 can be a multi-throw RF switch, where each switching arm, i.e., switching arm 116 and switching arm 118, is coupled between a separate input and a shared output of the switch. In an embodiment, harmonic phase tuning filter 106 can be configured to provide a selected impedance at a harmonic frequency, such as a second or third harmonic frequency, generated by RF switch 104 by appropriately tuning the phase of the harmonic so as to improve the harmonic performance of the switch. In an embodiment, harmonic phase tuning filter 106 can be tuned to provide, for example, a high impedance at a third harmonic frequency generated by RF switch 104 (in the present application, a "harmonic frequency" includes the precise harmonic frequency and also frequencies that are sufficiently close to the precise harmonic frequency, collectively referred to herein as "approximately a harmonic frequency").

In the present application, a harmonic impedance that is sufficiently high so as to cause substantially an open circuit at a harmonic frequency, such as a second or third harmonic frequency, is defined as a "phase open" and a harmonic impedance that is sufficiently low so as to cause substantially a short circuit at the harmonic frequency is defined as a "phase short." In one embodiment, harmonic phase tuning filter 106 can be tuned to provide a selected impedance at a harmonic frequency, such as a third harmonic frequency, generated by the RF switch, where the selected impedance is achieved by appropriately rotating the phase of harmonic frequency between a phase open and a phase short.

Harmonic phase tuning filter 106 can also be configured to reduce the harmonic level, such as the third harmonic level, generated by power amplifier 110. Harmonic phase tuning filter 106 can be further configured to provide an output impedance, such as a 50.0 ohm output impedance, that substantially matches the input impedance of switching arm 116 of RF switch 102 at a fundamental frequency, which is inputted into the switching arm from power amplifier 110 (in the present application, a "fundamental frequency" includes the precise fundamental frequency and also frequencies that are sufficiently close to the precise fundamental frequency, collectively referred to herein as "approximately a fundamental frequency").

Thus, while being tuned to provide a selected impedance at a harmonic frequency generated by RF switch 102, harmonic phase tuning filter 106 is also tuned to provide an output impedance that substantially matches the input impedance of the RF switch at the fundamental frequency.

Also shown in FIG. 1, the output of switching arm 116 is coupled to the output of switching arm 118 at node 124, which is coupled to antenna 114 via the shared output of RF switch 102. Further shown in FIG. 1, the output of power amplifier 112 is coupled to the input of harmonic phase tuning filter 108 via line 126 and the output of harmonic phase tuning filter 108 is coupled to the input of switching arm 118 at an input of RF switch 104 by line 128. Power amplifier 112 can output an RF signal, such as an 900.0 MHz low band GSM signal, for transmission over antenna 114 when switching arm 118 of RF switch 102 is enabled. The RF signal outputted by power amplifier 112 can have a different frequency than the frequency of the RF signal outputted by power amplifier 110. Harmonic phase tuning filter 108 can be configured in a substantially similar manner to harmonic phase tuning filter 106 discussed above. However, since the fundamental frequency of the RF signal inputted into harmonic phase tuning filter 108 is different than the fundamental frequency inputted into harmonic phase tuning filter 106, harmonic phase tuning filter 108 is tuned to provide a desired impedance at a different harmonic frequency than harmonic phase tuning filter 106.

By tuning the phase of a harmonic, such as a second or third harmonic, to match a particular RF switch, such as RF switch 104, which is integrated with harmonic phase tuning filters, such as harmonic phase tuning filters 106 and 108, the invention advantageous improves the harmonic performance of the RF switch.

Figure 2:
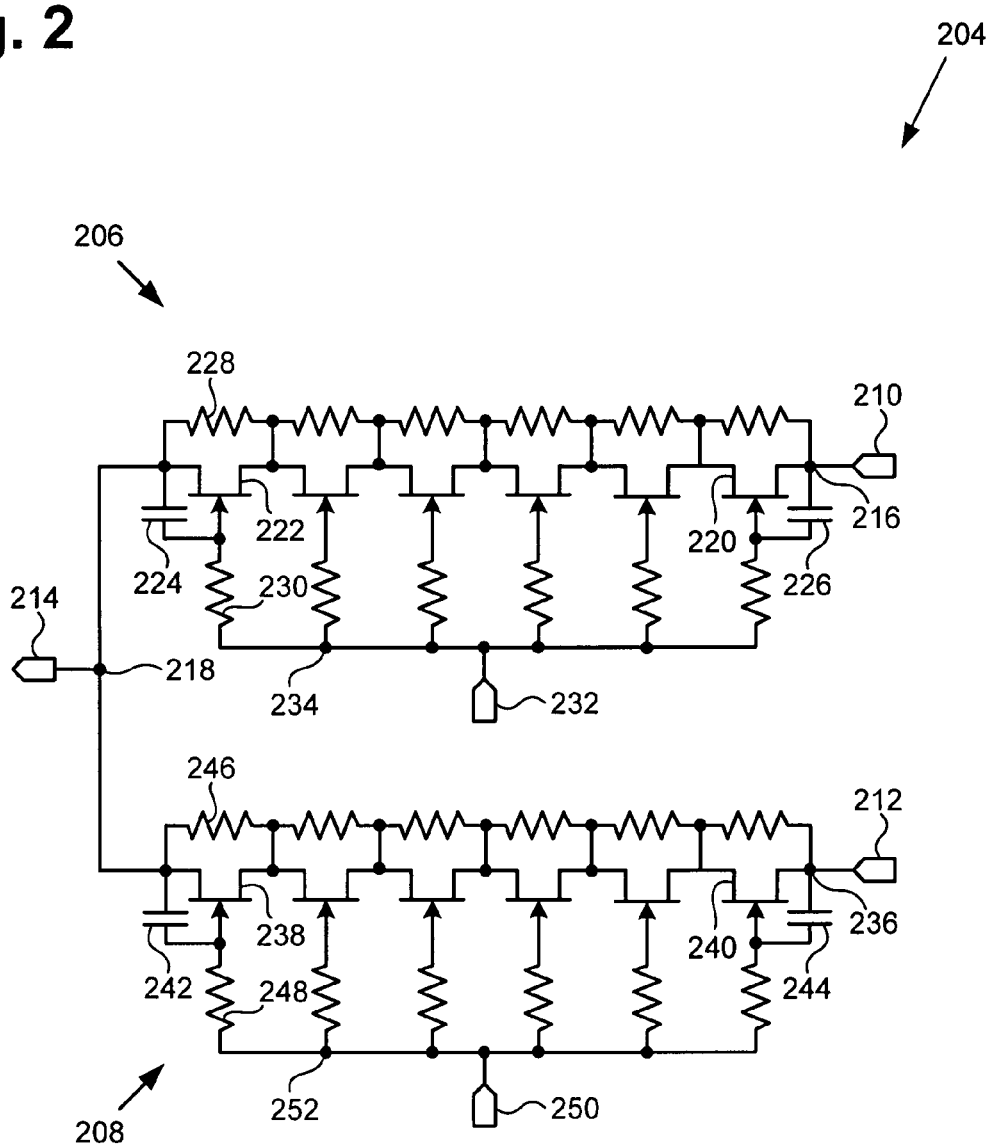
FIG. 2 illustrates a diagram of an exemplary RF switch in accordance with one embodiment of the present invention.

FIG. 2 shows a schematic diagram of RF switch 204 in accordance with one embodiment of the present invention. RF switch 204 corresponds to RF switch 104 in RF switching module 102 in FIG. 1. In particular, switching arms 206 and 208 in RF switch 204 correspond, respectively, to switching arms 116 and 118 in RF switch 104. RF switch 204 is an exemplary multi-throw RF switch that can be integrated with the invention's harmonic phase tuning filters, such as harmonic phase tuning filters 106 and 108 in FIG. 1, to improve the RF switch's harmonic performance. RF switch 204 can be integrated with the invention's harmonic phase tuning filters and utilized in wireless communications devices, such as cellular telephones, that utilize GSM or W-CDMA communications standards. In one embodiment, RF switch 204 can include more than two switching arms.

As shown in FIG. 2, RF switch 204 has signal inputs 210 and 212, which can be RF signal inputs, and signal output 270, which can be an RF signal output and which is also referred to as a "shared output" in the present application. Signal inputs 210 and 212 can each be coupled to an output of the invention's harmonic phase tuning filter, such as harmonic phase tuning filters 106 and 108 in FIG. 1. Signal output 270 can be coupled to an antenna, such as antenna 114 in FIG. 1.

Also shown in FIG. 2, the input of switching arm 206 is coupled to signal input 210 at node 216 and the output of switching arm 206 is coupled to signal output 214 at node 218. Switching arm 206 can include six FETs, such as FETs 220 and 222, which are coupled in series between nodes 216 and 218. Each of the FETs in switching arm 206 can be, for example, an NFET. Further shown in FIG. 2, capacitor 224 is coupled between the drain and gate of FET 222 and capacitor 226 is coupled between the source and gate of FET 220. Also shown in FIG. 2, a resistor, such as resistor 228, is coupled between the drain and source of each FET in switching arm 206 and a resistor, such as resistor 230, is coupled between the gate of each FET in switching arm 206 and control voltage input 232 and node 234.

Further shown in FIG. 2, the input of switching arm 208 is coupled to signal input 212 at node 236 and the output of switching arm 208 is coupled to signal output 214 at node 218. Switching arm 208 can include six FETs, such as FETs 238 and 240, which are coupled in series between nodes 236 and 218. Each of the FETs in switching arm 206 can be, for example, an NFET. Further shown in FIG. 2, capacitor 242 is coupled between the drain and gate of FET 238 and capacitor 244 is coupled between the source and gate of FET 240. Also shown in FIG. 2, a resistor, such as resistor 246, is coupled between the drain and source of each FET in switching arm 208 and a resistor, such as resistor 248, is coupled between the gate of each FET in switching arm 208 and control voltage input 250 and node 252.

In RF switch 204, control voltage inputs 232 and 250 can receive a high control voltage (VH), which can be between approximately 2.4 volts and approximately 6.1 volts, for example, to enable, i.e., turn on, respective switching arms 206 and 208. Control voltage inputs 232 and 250 can also receive a low control voltage (VL), which can be approximately 0.0 volts, for example, to disable, i.e., turn off, respective switching arms 206 and 208.

The operation of RF switch 204 will now be discussed. Switching arm 206 can be enabled by applying VH (i.e. a high control voltage) to control voltage input 232 to turn on the FETs in switching arm 206, and switching arm 208 can be disabled by applying VL (i.e. a low control voltage) to control voltage input 250 to turn off the FETs in switching arm 208, and vice versa. Thus, in RF switch 204, either switching arm 206 can be enabled and switching arm 208 can be disabled, or switching arm 206 can be disabled and switching arm 208 can be enabled. In the present application, the switching arm that is enabled is also referred to as the "ON arm" and the switching arm that is disabled is also referred to as the "OFF arm." When switching arm 206 is enabled and switching arm 208 is disabled, for example, signal input 210 is coupled to signal output 214 such that an RF signal, e.g., an 1800.0 MHz high band GSM signal, is allowed to pass through the FETs in the ON arm to signal output 214. Also, signal input 212 is decoupled from signal output 214 such that another RF signal, e.g., a 900.0 MHz low band GSM signal, at signal input 212 is prevented from passing through the FETs in the OFF arm to signal output 270.

When switching arm 206 is enabled and switching arm 208 is disabled, an RF signal at signal output 214 provides a peak RF voltage (Vrf) at node 218, which is equally divided between gate/drain and gate/source junctions of each FET in the OFF arm, i.e., switching arm 208, and vice versa. A high Vrf at node 218 can cause the voltage at the gate/drain and gate/source junctions of each FET in the OFF arm to approach the pinch off region of the FET, which can cause an undesirable increase in harmonic levels (i.e. amplitudes), such as the third harmonic level, by causing one or more of the FETs in the OFF arm to turn on.

There are two primary mechanisms to limit the amplitude of the harmonics, such as the third harmonic, of RF switch 204: voltage limitation and current limitation. The absolute value of the third harmonic amplitude for high values of VH is typically limited by the current capability of the switch, i.e., the size of the FETs in the switching arms, and for low values of VH the absolute value of the third harmonic amplitude is typically limited by how close the swing of Vrf comes to the pinch off region of the FETs in the OFF arm. The number of FETs in each switching arm can affect both the current and voltage limitations.

In the present application, a voltage level of VH below approximately 4.3 volts can be referred to as a "voltage limited region" and a voltage level of VH above approximately 4.3 volts can be referred to as a "current limited region." The second and third harmonic levels increase at a 50.0 ohm impedance termination as VH decreases in the voltage limited region. The voltage and current limited regions each require different impedance terminations at the second and third harmonics to reduce harmonic levels in the RF switch. For example, compared to a third harmonic level at a 50.0 ohm impedance termination, a high impedance termination at the third harmonic frequency causes a reduction in the third harmonic level in the voltage limited region and an increase in the third harmonic level in the current limited region. For example, compared to the third harmonic level at a high impedance termination, a low impedance termination causes an increase in the third harmonic level in the voltage limited region and a reduction in the third harmonic level in the current limited region.

In the present invention, harmonic phase tuning filters, such as harmonic phase tuning filters 106 and 108 in FIG. 1, are integrated with a multi-throw RF switch, such as RF switch 204, and are configured to provide a selected impedance, such as a phase open or phase short, at a harmonic frequency, such as a second or third harmonic frequency, by appropriately tuning the phase of the harmonic so as to improve the harmonic performance of the switch. For example, if an RF switch, such as RF switch 204, is voltage limited, i.e., VH is in the voltage limited region, a harmonic phase tuning filter coupled to each switching arm can be tuned for a phase open at the third harmonic frequency to reduce the third harmonic level in the RF switch. For example, if the RF switch is current limited, i.e., VH is in the current limited region, the harmonic phase tuning filter can be tuned for a phase short at the third harmonic frequency to reduce the third harmonic level in the RF switch.

Generally, the ON arm is more responsible for the current limitation and the OFF arm is more responsible for the voltage limitation. A high impedance that causes substantially an open circuit at the third harmonic, i.e., a phase open, may reduce the third harmonic level in the ON arm and increase the third harmonic level in the OFF arm, while a phase short may increase the third harmonic level in the ON arm and reduce the third harmonic level in the OFF arm. An embodiment of the invention's harmonic phase tuning filter can be tuned between a phase short and an phase open so as to provide an optimum impedance at a harmonic frequency, such as a third harmonic frequency, which advantageously improves or increases harmonic performance in both ON and OFF arms of the RF switch.

Figure 3:
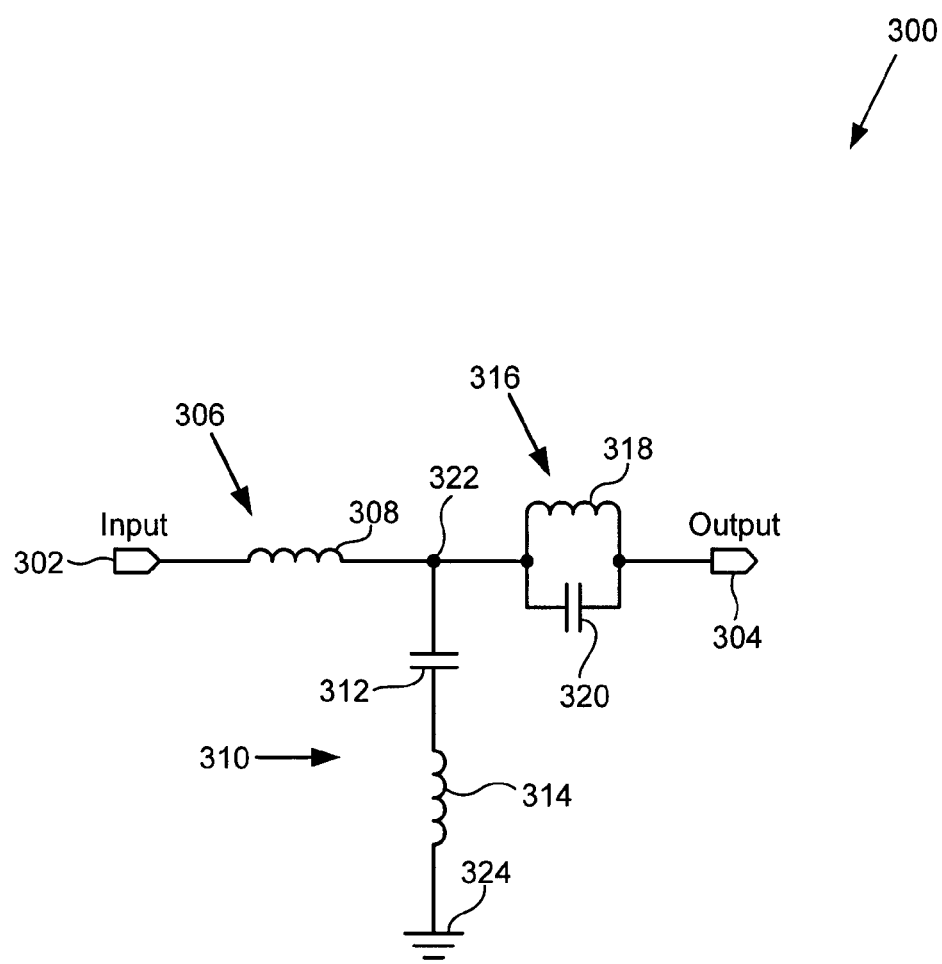
FIG. 3 illustrates a diagram of an exemplary harmonic phase tuning filter in accordance with one embodiment of the present invention.

FIG. 3 shows a schematic diagram of harmonic phase tuning filter 300 in accordance with one embodiment of the present invention. Harmonic phase tuning filter 300 is an exemplary embodiment of the invention's harmonic phase tuning filter, such as harmonic phase tuning filters 106 and 108 in FIG. 1. Harmonic phase tuning filter 300 includes input terminal 302, output terminal 304, series leg 306, which includes inductor 308, shunt leg 310, which includes capacitor 312 and inductor 314 (also referred to as an "LC circuit" in the present application), and series leg 316, which includes inductor 318 and capacitor 320 (also referred to as an "LC circuit" in the present application).

As shown in FIG. 3, a first terminal of inductor 308 is coupled to input terminal 302 and a second terminal of inductor 308 is coupled to first terminals of capacitor 312, inductor 318 and capacitor 320 at node 322. Also shown in FIG. 3, a second terminal of capacitor 312 is coupled to a first terminal of inductor 314, a second terminal of inductor 314 is coupled to ground 324, and second terminals of inductor 318 and capacitor 320 are coupled to output terminal 304 at node 326.

Harmonic phase tuning filter 300, which comprises a T-type filter, can be coupled to an input of an RF switch, such as RF switch 104 in FIG. 1, and can be configured to provide a high impedance barrier, such as a phase open, at a harmonic frequency, such as a second or third harmonic frequency, generated by the RF switch. For example, harmonic phase tuning filter 300 can be configured to provide a phase open at a third harmonic of an RF switch, such as a multi-throw RF switch, by appropriately selecting the values of inductor 318 and capacitor 320 in series leg 316. Harmonic phase tuning filter 300 can also be configured to provide an output impedance, such as a 50.0 ohm output impedance, to substantially match the input impedance of the RF switch at a fundamental frequency of an RF signal coupled to the input of the RF switch.

Thus, harmonic phase tuning filter 300 can provide a high impedance barrier, such as a phase open, at a harmonic frequency, such as a second or third harmonic frequency, generated by the RF switch, such as a multi-throw RF switch, without significantly affecting the phase of the fundamental frequency. By providing a high impedance at, for example, a third harmonic frequency, an embodiment of the invention's harmonic phase tuning filter can advantageously reduce a third harmonic level generated by a RF switch, such as a multi-throw RF switch, thereby advantageously improving harmonic performance of the RF switch while maintaining a desired output impedance, such as a 50.0 output impedance, at the fundamental frequency of the RF input signal.

Figure 4:
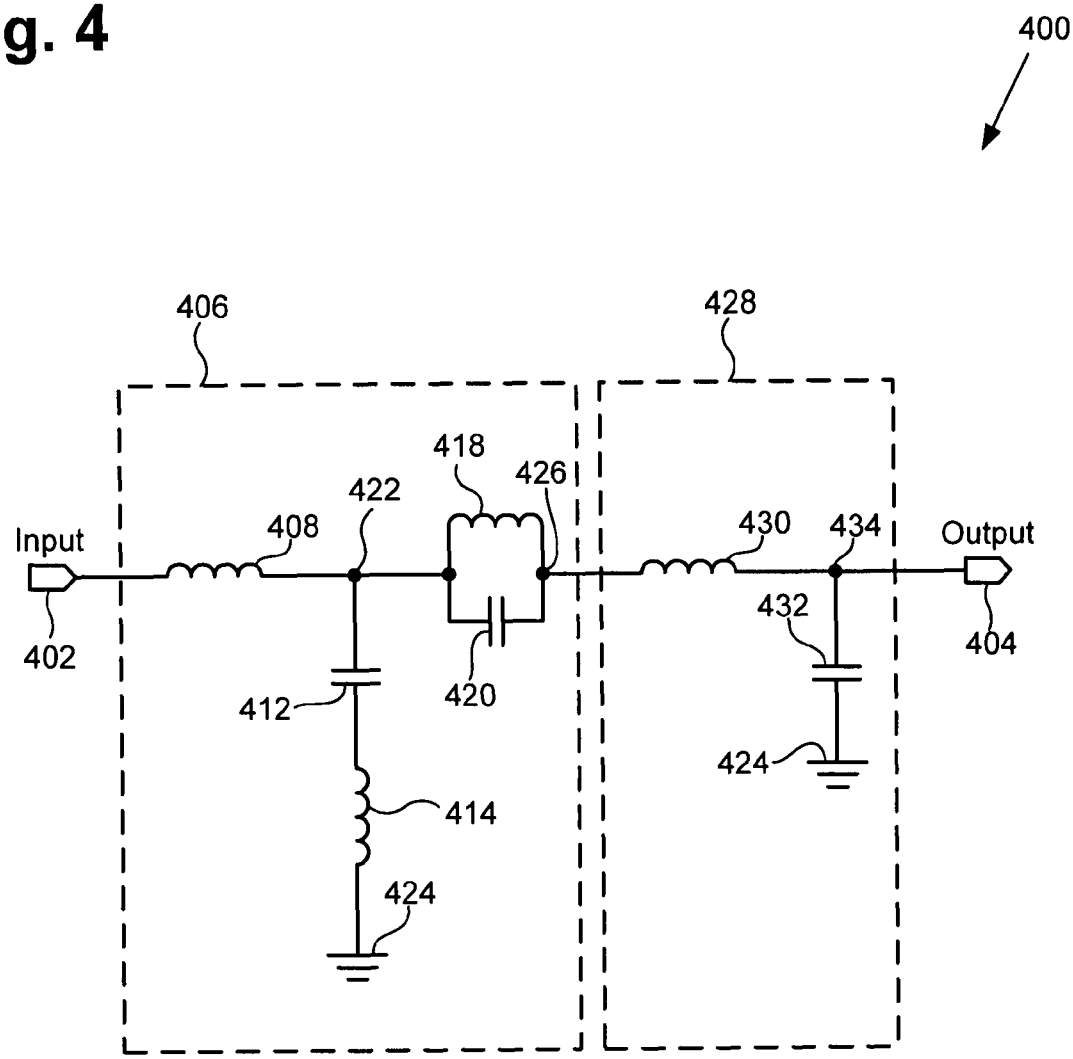
FIG. 4 illustrates a diagram of an exemplary harmonic phase tuning filter in accordance with another embodiment of the present invention.

FIG. 4 shows a schematic diagram of harmonic phase tuning filter 400 in accordance with one embodiment of the present invention. Harmonic phase tuning filter 400 is another exemplary embodiment of the invention's harmonic phase tuning filter, such as harmonic phase tuning filters 106 and 108 in FIG. 1. Harmonic phase tuning filter 400 includes input terminal 402, output terminal 404, input section 406, which comprises inductors 408, 414, and 418 and capacitors 412 and 420, and output section 428, which comprises inductor 430 and capacitor 432. In harmonic phase tuning filter 400, input filter section 406 is coupled in series with output filter section 428 between input terminal 402 and output terminal 404. Input section 406 corresponds to harmonic phase tuning filter 300 in FIG. 3. In particular, inductors 408, 414, and 418 and capacitors 412 and 420 in input section 406 correspond, respectively, to inductors 308, 314, and 318 and capacitors 312 and 320 in harmonic phase tuning filter 300. In other embodiments, output section 428 can comprise a single capacitor or a single inductor.

As shown in FIG. 4, a first terminal of inductor 408 is coupled to input terminal 402 and a second terminal of inductor 408 is coupled to first terminals capacitors 412 and 420 and inductor 418 at node 422. Also shown in FIG. 4, a second terminal of capacitor 412 is coupled to a first terminal of inductor 414 and a second terminal of inductor 414 is coupled to ground 424. Further shown in FIG. 4, second terminals of capacitor 418 and inductor 420 are coupled to a first terminal of inductor 430 at node 426, a second terminal of inductor 430 is coupled to output terminal 404 and a first terminal of capacitor 432, and a second terminal of capacitor 432 is coupled to ground 424. Each capacitor-inductor pair, i.e. capacitor 412 and inductor 414, capacitor 420 and inductor 418, capacitor 432 and inductor 430 may be also referred to as an "LC circuit" in the present application.

Input terminal 402 of harmonic phase tuning filter 400 can be coupled to the output of a power amplifier, such as power amplifier 110 in FIG. 1, and output terminal 404 of harmonic phase tuning filter 400 can be coupled to an input of an RF switch, such as RF switch 104. In harmonic phase tuning filter 400, capacitor 420 and inductor 418 of input section 406 form a tuned circuit, which provides a high impedance, such as a phase open, at, for example, a third harmonic frequency generated by the RF switch, such as RF switch 104 in FIG. 1. Harmonic phase tuning filter 400 can be configured to provide an output impedance, such as a 50.0 ohm output impedance, that substantially matches an input impedance of the RF switch at a fundamental frequency. Harmonic phase tuning filter 400 can also be configured to provide a selected impedance at a harmonic frequency, such as a second or a third harmonic frequency, generated by the RF switch. The selected impedance can be provided by appropriately tuning an LC circuit comprising inductor 430 and capacitor 432 in output section 428 of harmonic phase tuning filter 400.

The selected impedance can be an optimal impedance for improving the harmonic performance of the RF switch. For example, the selected impedance can improve the harmonic performance of the RF switch by optimally reducing the harmonic level, such as the third harmonic level, in both ON and OFF arms of the RF switch. In the present embodiment, the selected impedance can be determined by rotating the phase of the harmonic frequency, such as a third harmonic frequency, to a desired impedance situated between a phase open and a phase short. The selected impedance depends on the particular harmonic frequency that is generated by the RF switch, which depends on the fundamental frequency of the RF signal that is coupled to an input of the switch via harmonic phase tuning filter 400. Harmonic phase tuning filter 400 can be further configured to reduce the level of harmonics, such as second and third harmonic levels, generated by a power amplifier, such as power amplifiers 110 and 112, coupled to input terminal 402 of the harmonic phase tuning filter.

Figure 5:
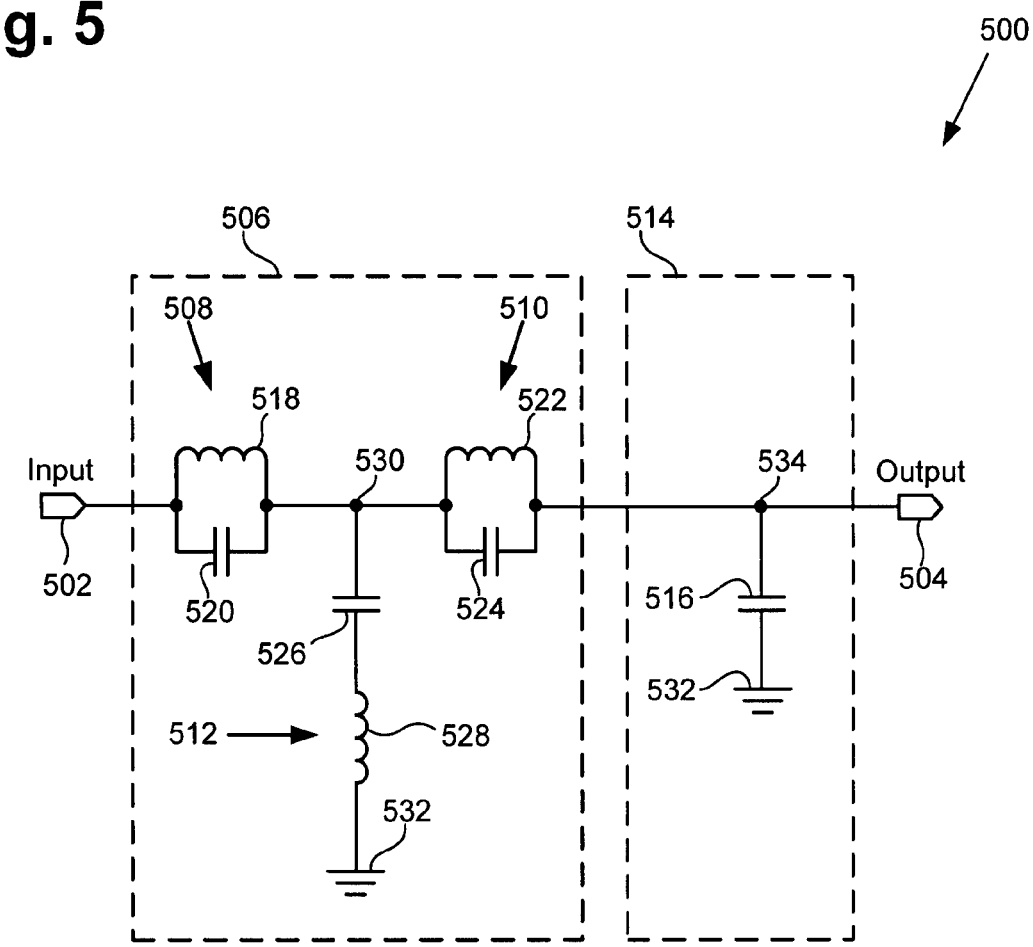
FIG. 5 illustrates a diagram of an exemplary harmonic phase tuning filter in accordance with yet another embodiment of the present invention.

FIG. 5 shows a schematic diagram of harmonic phase tuning filter 500 in accordance with one embodiment of the present invention. Harmonic phase tuning filter 500 is another exemplary embodiment of the invention's harmonic phase tuning filter, such as harmonic phase tuning filters 106 and 108 in FIG. 1. Harmonic phase tuning filter 500 includes input terminal 502, output terminal 504, input section 506, which includes series legs 508 and 510 and shunt leg 512, and output section 514, which comprises capacitor 516. In input section 506, series leg 508 comprises inductor 518 and capacitor 520, series leg 510 comprises inductor 522 and capacitor 524, and shunt leg 512 comprises capacitor 526 and inductor 528. Input section 506 is similar to harmonic phase tuning filter 300 in FIG. 3. In particular, shunt leg 512 and series leg 510 in input section 506 of harmonic phase tuning filter 500 correspond, respectively, to shunt leg 310 and series leg 316 of harmonic phase tuning filter 300. However, series leg 508 in input section 506 of harmonic phase tuning filter 500 comprises inductor 508 coupled in parallel with capacitor 520, whereas series leg 306 in harmonic phase tuning filter 300 comprises only inductor 308. In harmonic phase tuning filter 400 in FIG. 4, output section 428 comprises inductor 430 and capacitor 432. In contrast, output section 514 of harmonic phase tuning filter 500 comprises only capacitor 516.

As shown in FIG. 5, first terminals of inductor 518 and capacitor 520 are coupled to input terminal 502 and second terminals of inductor 518 and capacitor 520 are coupled to first terminals capacitors 526 and 524 and inductor 522 at node 530. For example, capacitors 520, 524, and 526 might have respective values of 2.5, 1.0, and 2.0 picofarads (pF) and inductors 518 and 522 might each have a value of 3.3 nanohenries (nH). Also shown in FIG. 5, a second terminal of capacitor 526 is coupled to a first terminal of inductor 528 and a second terminal of inductor 528 is coupled to ground 532. For example, inductor 528 might have a value of 2.6 nH. Further shown in FIG. 5, second terminals of capacitor 524 and inductor 522 are coupled to a first terminal of capacitor 516 and output terminal 504 at node 534 and a second terminal of capacitor 516 is coupled to ground 532. Capacitor 516 might have a value of, for example, 0.4 pF. Each capacitor-inductor pair, i.e. capacitor 520 and inductor 518, capacitor 526 and inductor 528, capacitor 524 and inductor 522 may be also referred to as an "LC circuit" in the present application.

Input terminal 502 of harmonic phase tuning filter 500 can be coupled to the output of a power amplifier, such as power amplifier 110 in FIG. 1, and output terminal 504 of harmonic phase tuning filter 500 can be coupled to an input of an RF switch, such as RF switch 104. In harmonic phase tuning filter 500, capacitor 524 and inductor 522 of input section 506 form a tuned circuit, which provides a high impedance, such as a phase open, at, for example, a third harmonic frequency generated by the RF switch, such as RF switch 104 in FIG. 1. Harmonic phase tuning filter 500 can be configured to provide an output impedance, such as a 50.0 ohm output impedance, that substantially matches an input impedance of the RF switch at a fundamental frequency. Harmonic phase tuning filter 500 can also be configured to provide a selected impedance at a harmonic frequency, such as a second or a third harmonic frequency, generated by the RF switch. The selected impedance can be provided by selecting an appropriate value for capacitor 516 in output section 514 of harmonic phase tuning filter 500.

The selected impedance can be an optimal impedance for improving the harmonic performance of the RF switch. For example, the selected impedance can improve the harmonic performance of the RF switch by optimally reducing the harmonic level, such as the third harmonic level, in both ON and OFF arms of the RF switch. In the embodiment in FIG. 5, the selected impedance can be determined by a capacitive rotation of the phase of the harmonic frequency, such as a third harmonic frequency, from a phase open to a desired impedance situated between a phase open and a phase short. The selected impedance depends on the particular harmonic frequency that is generated by the RF switch, which depends on the fundamental frequency of the RF signal that is coupled to an input of the switch via harmonic phase tuning filter 500. Harmonic phase tuning filter 500 can be further configured to reduce the level of harmonics, such as second and third harmonic levels, generated by a power amplifier, such as power amplifiers 110 and 112, coupled to input terminal 502 of the harmonic phase tuning filter.

Figure 6:
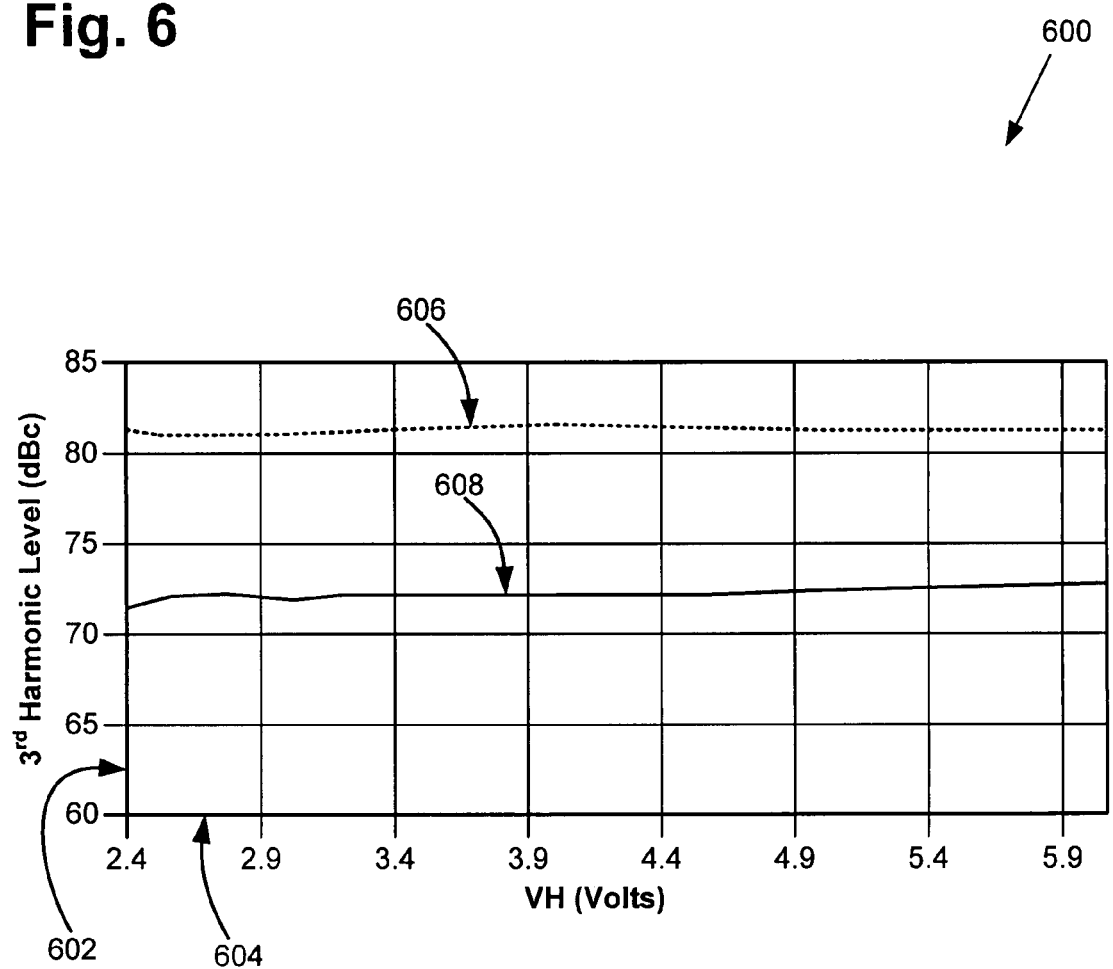
FIG. 6 is a graph showing exemplary third harmonic level curves in accordance with one embodiment of the present invention.

FIG. 6 shows graph 600 including exemplary third harmonic level curves in accordance with one embodiment of the present invention. Graph 600 includes third harmonic level axis 602, VH axis 604, and third harmonic level curves 606 and 608. In graph 600, third harmonic level axis 602 represents an exemplary range of a third harmonic level generated by an RF switch, such as RF switch 204 in FIG. 2, as measured in dBc relative to a first harmonic level. Thus, a higher value on third harmonic level axis 602 indicates a lower third harmonic level relative to the level of the first harmonic. In graph 600, VH axis 604 represents an exemplary range of VH, i.e., a high control voltage applied to an ON arm of an RF switch, such as RF switch 204, as measured in volts.

In graph 600, third harmonic level curve 606 represents the third harmonic level generated in an RF switch, such as RF switch 204, over a range of VH between 2.4 volts and 5.9 volts, where the RF switch is coupled to an embodiment of the invention's harmonic phase tuning filter 500 in FIG. 5. In graph 600, third harmonic level curve 608 represents the third harmonic level generated in an RF switch, such as RF switch 204, over the same range of VH, where the RF switch is not coupled to an embodiment of the invention's harmonic phase tuning filter, and where the RF switch provides a 50.0 ohm termination at the third harmonic frequency.

In the example in graph 600, third harmonic level curve 606 indicates a third harmonic level of approximately 82 dBc over a range of VH of between 2.4 volts and 5.9 volts, while third harmonic level curve 608 indicates a third harmonic level of approximately 72 dBc over the same range of VH. Thus, as shown in the example in graph 600, a reduction of approximately 10 dBc in the third harmonic level generated by an RF switch, such as RF switch 204, is achieved by utilizing an embodiment of the invention's harmonic phase tuning filter 500 to provide a selected impedance at the third harmonic frequency to match the third harmonic level generated by the RF switch.

Thus, as discussed above, an embodiment of the invention's harmonic phase tuning filter in FIG. 3 can be integrated with an RF switch to provide a high impedance, such as a phase open, at a harmonic frequency, such as a third harmonic frequency, generated by the RF switch. Embodiments of the invention's harmonic phase tuning filter in FIGS. 4 and 5 can be integrated with an RF switch, such as a multi-throw RF switch, and tuned to provide a selected impedance at a harmonic frequency, such as a third harmonic frequency, generated by the RF switch. The selected impedance can be selected between a phase open and a phase short to achieve an optimal impedance at a harmonic frequency, such as a third harmonic frequency, generated by the RF switch, thereby advantageously improving harmonic performance of the RF switch.

Also, while providing a low impedance or a selected impedance at a harmonic frequency generated by an RF switch, such as a multi-throw RF switch, embodiments of invention's harmonic phase tuning filter also provide an output impedance, such as a 50.0 ohm output impedance, that substantially matches the input impedance of the RF switch at a fundamental frequency.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a switching module with harmonic phase tuning filter has been described.

The invention claimed is:

1. A switching module comprising:
   a first harmonic phase tuning filter coupled to a first input of an RF switch;
   said first harmonic phase tuning filter including an input section comprising a T-type LC filter and an output section;
   said first harmonic phase tuning filter configured to provide an output impedance that substantially matches an input impedance of said RF switch at approximately a fundamental frequency;
   wherein said output section is tuned to provide a selected impedance at approximately a harmonic frequency generated by said RF switch;
   wherein said T-type LC filter comprises first and second series legs and a shunt leg coupled between said first and second series legs in a shunt configuration, said shunt leg comprising a first inductor coupled in series with a first capacitor;
   wherein said second series leg comprises a first parallel LC circuit and is tuned to provide a high impedance barrier at approximately said harmonic frequency; and
   wherein said output section includes an output terminal coupled to said first input of said RF switch, and a shunt capacitor directly coupled to said output terminal;
   wherein said selected impedance causes substantially an open circuit at approximately said harmonic frequency.

2. The switching module of claim 1, wherein said harmonic frequency is a third harmonic frequency.

3. The switching module of claim 1, wherein said output section of said first harmonic phase tuning filter further comprises an inductor, said inductor and said shunt capacitor forming an LC circuit.

4. The switching module of claim 1, further comprising a second harmonic phase tuning filter coupled to a second input of said RF switch.

5. The switching module of claim 4, wherein said RF switch and said first and second harmonic phase tuning filters are fabricated on a single semiconductor die.

6. The switching module of claim 1, wherein said first series leg comprises a second inductor.

7. The switching module of claim 6, wherein said first series leg further comprises a second capacitor coupled in parallel with the second inductor to form a second parallel LC circuit.

8. A switching module comprising:

a first harmonic phase tuning filter coupled to a first input of an RF switch;

wherein said first harmonic phase tuning filter comprises an input section including an input terminal, and an output section coupled in series between said input section and an output terminal of said first harmonic phase tuning filter, said output terminal coupled to said first input of said RF switch;

wherein said input section includes a first LC circuit which comprises a shunt leg coupled between two series legs, said shunt leg comprising a second LC circuit, and a first series leg of said two series legs comprising a parallel LC circuit; and said first harmonic phase tuning filter configured to provide an output impedance that substantially matches an input impedance of said RF switch at approximately a fundamental frequency;

wherein said parallel LC circuit is tuned to provide a high impedance barrier at approximately a harmonic frequency generated by said RF switch; and wherein said output section includes a shunt capacitor directly connected to said output terminal of said first harmonic phase tuning filter; and wherein said output section further comprises a series inductor coupled between said input section and said output terminal.

* * * * *